(12) United States Patent
Jung et al.

(10) Patent No.: US 8,786,026 B2
(45) Date of Patent: Jul. 22, 2014

(54) OPTIMIZED CHANNEL IMPLANT FOR A SEMICONDUCTOR DEVICE AND METHOD OF FORMING THE SAME

(75) Inventors: Mukyeng Jung, Hwaseong-si (KR); No Young Chung, WhaSung (KR); Kyung Woo Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

(21) Appl. No.: 13/029,626

(22) Filed: Feb. 17, 2011

(65) Prior Publication Data

US 2012/0211843 A1  Aug. 23, 2012

(51) Int. Cl.
*H01L 27/088* (2006.01)
*H01L 21/336* (2006.01)

(52) U.S. Cl.
USPC ........... 257/385; 257/382; 257/383; 257/384; 257/E29.134

(58) Field of Classification Search
USPC ................................................. 257/315, 401
See application file for complete search history.

(56) References Cited

U.S. PATENT DOCUMENTS

| | | | | |
|---|---|---|---|---|
| 6,864,582 | B1 * | 3/2005 | Vashchenko et al. | 257/758 |
| 2006/0022240 | A1 * | 2/2006 | Huang et al. | 257/296 |
| 2007/0134909 | A1 * | 6/2007 | Klee et al. | 438/620 |
| 2009/0014796 | A1 * | 1/2009 | Liaw | 257/347 |

* cited by examiner

*Primary Examiner* — Victor A Mandala
*Assistant Examiner* — William Harriston
(74) *Attorney, Agent, or Firm* — F. Chau & Associates, LLC

(57) ABSTRACT

A semiconductor device, comprising a substrate, a plurality of polysilicon portions formed on the substrate, wherein the polysilicon portions are spaced apart from each other, a plurality of source/drain regions formed in the substrate between adjacent polysilicon portions, and a dielectric layer formed on the polysilicon portions and on the source/drain regions, wherein the dielectric layer includes a cavity filled with conductive material to form a contact area, the contact area overlapping part of a source/drain region and part of a polysilicon portion to electrically connect the polysilicon portion with the source/drain region, and wherein part of the contact area extends below an upper surface of the substrate to contact an implant region with the same doping as the source/drain region. The implant region is next to the source/drain region and includes part of a channel region in the substrate under the polysilicon portion.

11 Claims, 10 Drawing Sheets

OPTIMIZED CHANNEL IMPLANT FOR A SEMICONDUCTOR DEVICE AND METHOD OF FORMING THE SAME

BACKGROUND

1. Technical Field

The present disclosure relates to an optimized channel implant for a semiconductor device, such as a static random access memory (SRAM) device, and a method of forming same.

2. Discussion of the Related Art

In semiconductor devices, for example, SRAM devices, contact bridges may be formed between contacts in close proximity. Referring to FIG. 1, a plan view of a conventional semiconductor device 100 that can be disposed on an integrated circuit (IC) is shown. The device includes, for example, pass-gate (PG), pull-up (PU) and pull-down (PD) transistors. Using known lithography processes, a silicon substrate is etched to reduce the thickness of the silicon substrate, and form shallow trenches. Those portions of the silicon substrate that are not etched during lithography are referred to as silicon traces 102. A layer of polycrystalline silicon is applied on the silicon traces, and etched using known lithographic processes to form a plurality of polysilicon traces 104 on portions of the substrate including the silicon traces 102. FIG. 1 shows the configuration of the silicon and polysilicon traces 102, 104 with respect to each other. A single dielectric layer, or multiple dielectric layers, such as dielectric layers 110 and 112, are formed on the structure including the polysilicon traces 104. The dielectric layers 110 and 112 are etched to form cavities, such as cavity 113, shown in FIG. 2. Then, a conductive material such as, for example, tungsten, is deposited in the cavities to form conductive pillars. These pillars form conductive contacts or contact areas (CAs) 114, 116 that electrically contact the silicon and polysilicon traces 102, 104, respectively. The pillars also form contact area rectangle structures (CARECs) 118 to connect a gate (e.g., polysilicon trace 104) of one transistor to a source or drain of another transistor in close proximity.

FIG. 2 shows a cross sectional view of a portion the semiconductor device 100 shown in FIG. 1, as viewed along the B-cutting line in FIG. 1. As can be seen in FIG. 2, the CAREC 118 is formed in cavity 113 overlapping part of a polysilicon trace 104 and part of a silicon trace 102.

As is understood by those with ordinary skill the art, the polysilicon trace 104 is positioned over a channel area 120 of a transistor, and may serve as the gate of the transistor. On either side of the channel area 120 are source/drain regions 122 of the transistor that are oppositely doped with respect the channel region 120. For example, in the case of a p-channel field effect transistor (PFET), the source/drain regions are doped with P-type impurities and the channel region includes N-type doping, and in the case of an n-channel field effect transistor (NFET), the source/drain regions are doped with N-type impurities and the channel region includes P-type doping. For purposes of illustration, the drawings show a PFET, but it is to be understood that the illustrations of the conventional art, as well as of embodiments of the present inventive concept are merely examples, and are not so limited. Accordingly, it should be understood that the embodiments of the inventive concept also apply to NFET devices, wherein the dopants would be reversed from those in a PFET device.

With reference to FIG. 2, the source/drain regions 122 include a silicide layer 123 formed over a doped portion, in this case, a P-type doped portion. When the dielectric layers 110 and 112 are etched to form the cavity 113, part of the silicide layer 123 and part of the upper portion of the silicon trace 102 may be lost. As a result, when the cavity 113 is filled with conductive material to form the CAREC 118, the CAREC 118 extends below the top surface of the silicon trace 102 to electrically contact both the p-doped region and the n-doped region, thereby creating a short at area A1.

Accordingly, there exists a need for a semiconductor device, and method of forming a semiconductor device that avoids the n-p short created by leakage of the CAREC into the regions below the top surface of the silicon trace.

SUMMARY

A semiconductor device, according to an embodiment of the inventive concept, comprises a silicon trace doped with a first dopant, a plurality of polysilicon traces formed on the silicon trace, wherein the polysilicon traces are spaced apart from each other. A source/drain region is formed in the silicon trace between two adjacent polysilicon traces, and the source/drain region is doped with a second dopant opposite the first dopant. A channel region is in the silicon trace under one of the two adjacent polysilicon traces, wherein part of the channel region next to the source/drain region is doped with the second dopant.

The semiconductor device may further comprise a dielectric layer formed on the polysilicon traces and on the source/drain region, wherein the dielectric layer includes a cavity filled with conductive material to form a contact area. The contact area overlaps part of the source/drain region and part of the one of the two adjacent polysilicon traces to electrically connect the one of the two adjacent polysilicon traces with the source/drain region.

Part of the contact area may extend below an upper surface of the silicon trace to electrically connect the part of the channel region doped with the second dopant to the source/drain region, which is also doped with the second dopant. The contact area may be a contact area rectangle structure, and the conductive material may include tungsten.

The semiconductor device may further comprise another dielectric layer formed on the dielectric layer, wherein both dielectric layers include the cavity, and a silicide layer formed below an upper surface of the silicon trace in the source/drain region.

A semiconductor device, according to an embodiment of the inventive concept, comprises a substrate, a plurality of polysilicon portions formed on the substrate, wherein the polysilicon portions are spaced apart from each other. A plurality of source/drain regions are formed in the substrate between adjacent polysilicon portions, and a dielectric layer is formed on the polysilicon portions and on the source/drain regions. The dielectric layer includes a cavity filled with conductive material to form a contact area that overlaps part of a source/drain region and part of a polysilicon portion to electrically connect the polysilicon portion with the source/drain region. Part of the contact area extends below an upper surface of the substrate to contact an implant region with the same doping as the source/drain region.

The implant region may be next to the source/drain region and include part of a channel region in the substrate under the polysilicon portion.

An area of the first substrate doped with an opposite dopant from a dopant of the source/drain region and from a dopant of the implant region is shaped to avoid the implant region.

The opposite dopant area in a plan view may include a first branch located to a lateral side of the implant region and a second branch located below the implant region, wherein the first and second branches extend in the same direction, and are connected to each other. Alternatively, the first and second branches may be separated from each other.

The opposite dopant area in a plan view may include first and second branches extending in a first direction and a third branch positioned between and making an obtuse angle with respect to the first and second branches.

A computer system comprising the semiconductor device may be a personal computer (PC), a personal digital assistant (PDA), an MP3 player, a digital audio recorder, a pen-shaped computer, a digital camera, or a video recorder.

A method for forming a semiconductor device, according to an embodiment of the inventive concept, comprises performing a well implantation of a first dopant into a substrate, performing a channel implantation of a second dopant opposite the first dopant into the substrate, forming a polycrystalline silicon layer on the substrate, etching the polycrystalline silicon layer to form a plurality of polysilicon traces spaced apart from each other on the substrate, depositing a dielectric layer on the substrate including the polysilicon traces, etching the dielectric layer to form a cavity overlapping part of a polysilicon trace and part of a region between the polysilicon trace and an adjacent polysilicon trace, and filling the cavity with conductive material to form a contact area. An area of the channel implantation is controlled so that a first part of the substrate under the region between the polysilicon trace and the adjacent polysilicon trace is doped with the second dopant to form a source/drain region, and a second part of the substrate under the polysilicon trace is doped with the second dopant so that part of a channel region under the polysilicon trace is doped with the second dopant.

The contact area may electrically connect the polysilicon trace with the source/drain region, and a part of the contact area may extend below an upper surface of the substrate to contact the part of the channel region doped with the second dopant.

A resulting area including the first dopant avoids the part of the channel region under the polysilicon trace that is doped with the second dopant. The resulting area including the first dopant in a plan view may include a first branch located to a lateral side of and a second branch located below the part of the channel region under the polysilicon trace that is doped with the second dopant. The first and second branches may extend in the same direction, and may be connected to each other. Alternatively, the first and second branches may be separated from each other.

The resulting area including the first dopant in a plan view may include first and second branches extending in a first direction and a third branch positioned between and making an obtuse angle with respect to the first and second branches.

A system for transmitting or receiving data, according to an embodiment of the present inventive concept, comprises a memory device for storing a program, and a processor in communication with the memory device, wherein the memory device comprises a substrate, a plurality of polysilicon portions formed on the substrate, wherein the polysilicon portions are spaced apart from each other, a plurality of source/drain regions formed in the substrate between adjacent polysilicon portions, and a dielectric layer formed on the polysilicon portions and on the source/drain regions, wherein the dielectric layer includes a cavity filled with conductive material to form a contact area, the contact area overlapping part of a source/drain region and part of a polysilicon portion to electrically connect the polysilicon portion with the source/drain region, and wherein part of the contact area extends below an upper surface of the substrate to contact an implant region with the same doping as the source/drain region.

The system may comprise at least one of a mobile system, a portable computer, a web tablet, a mobile phone, a digital music player, or a memory card.

A semiconductor memory card, according to an embodiment of the inventive concept, comprises an interface part that interfaces with an external device, a controller that communicates with the interface part and a memory device via address and data buses, wherein the memory device comprises a substrate, a plurality of polysilicon portions formed on the substrate, wherein the polysilicon portions are spaced apart from each other, a plurality of source/drain regions formed in the substrate between adjacent polysilicon portions, and a dielectric layer formed on the polysilicon portions and on the source/drain regions, wherein the dielectric layer includes a cavity filled with conductive material to form a contact area, the contact area overlapping part of a source/drain region and part of a polysilicon portion to electrically connect the polysilicon portion with the source/drain region, and wherein part of the contact area extends below an upper surface of the substrate to contact an implant region with the same doping as the source/drain region.

BRIEF DESCRIPTION OF THE DRAWINGS

Exemplary embodiments of the present inventive concept will be described below in more detail, with reference to the accompanying drawings, of which:

FIG. 1 is a plan view of a conventional semiconductor device that can be disposed on an integrated circuit (IC);

DETAILED DESCRIPTION OF THE EMBODIMENTS

Exemplary embodiments of the present inventive concept now will be described more fully hereinafter with reference to the accompanying drawings. This inventive concept may, however, be embodied in many different forms and should not be construed as limited to the embodiments set forth herein.

Figure 2:
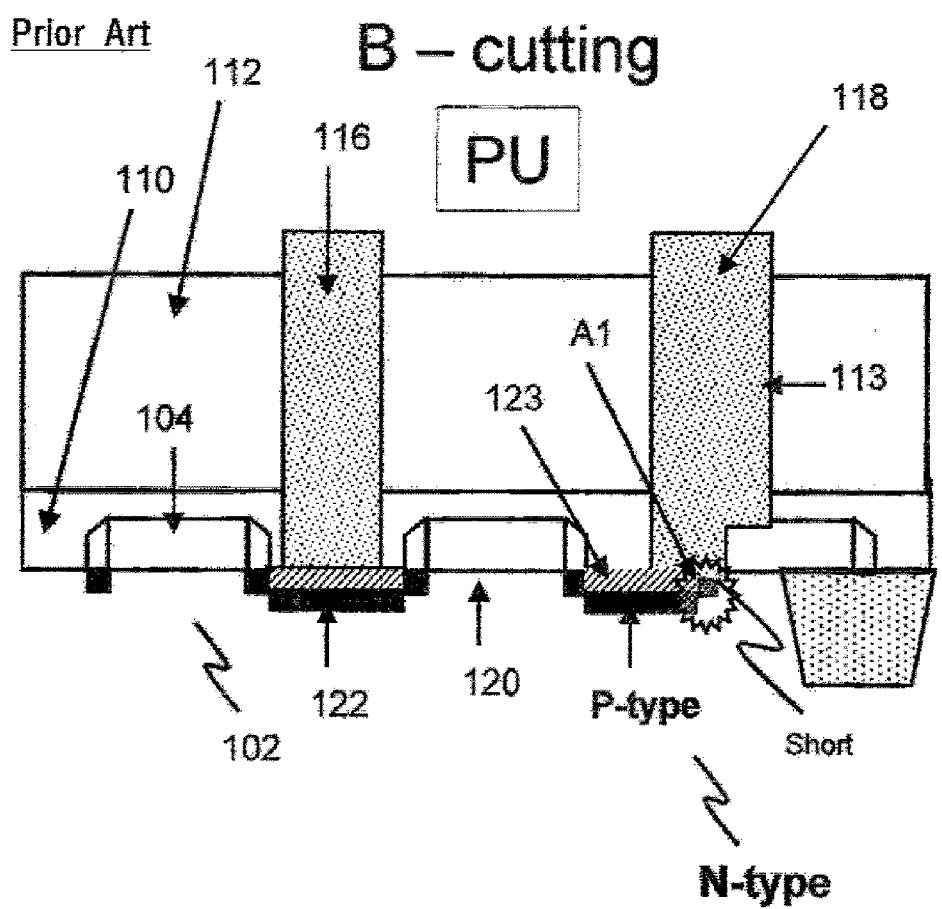
FIG. 2 is a cross-sectional view of a portion the semiconductor device shown in FIG. 1, as viewed along the B-cutting line in FIG. 1.
Figure 3:
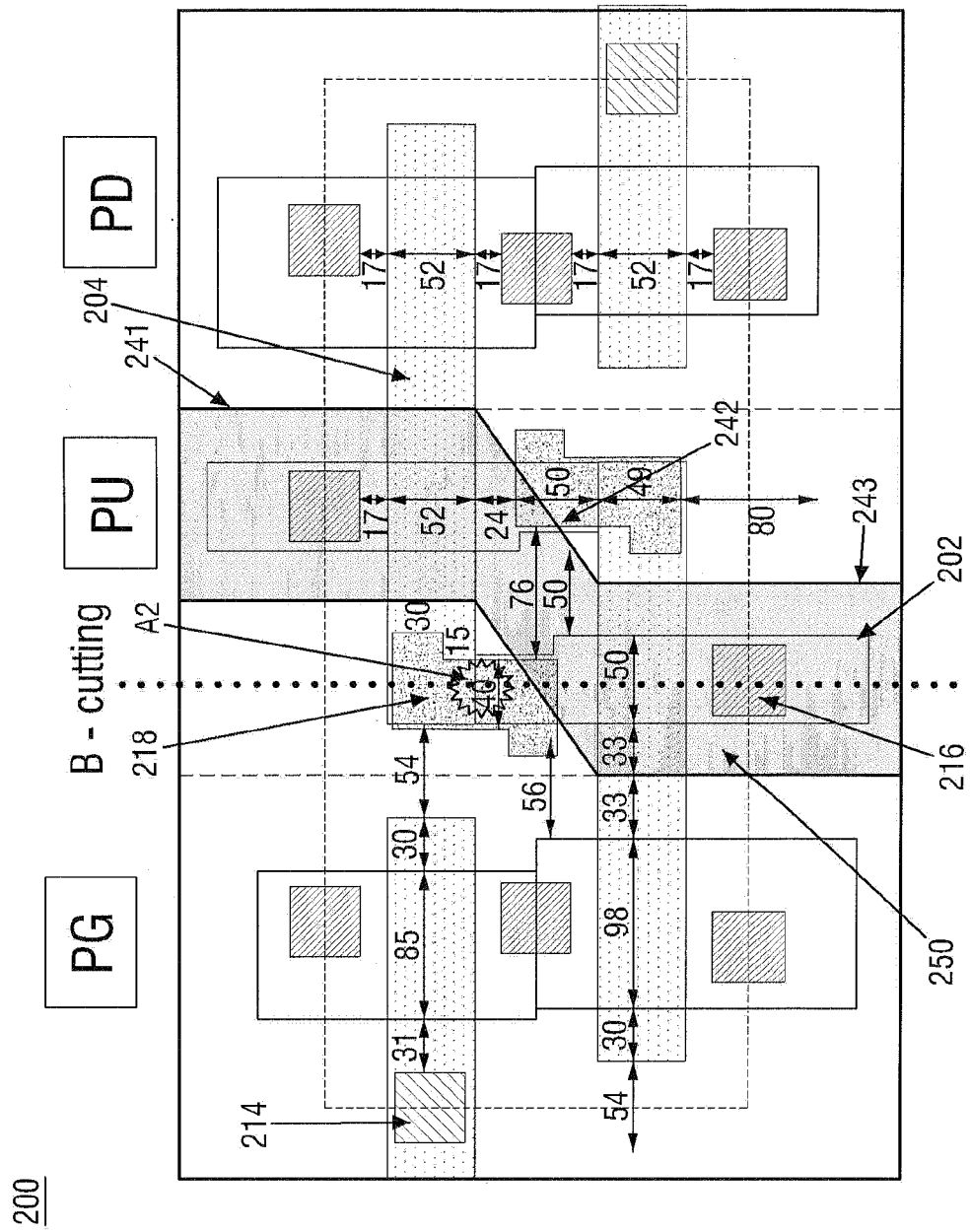
FIG. 3 is a plan view of a semiconductor device according to an embodiment of the present inventive concept.
Figure 4:
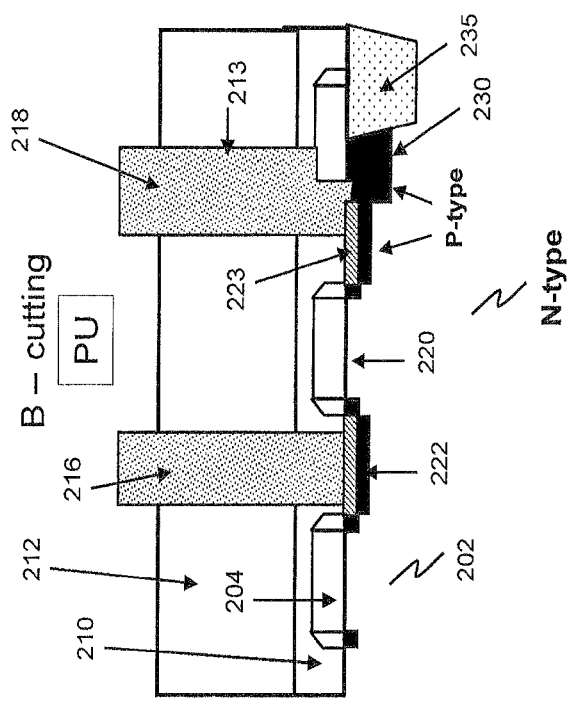
FIG. 4 is a cross-sectional view of a portion the semiconductor device shown in FIG. 3, as viewed along the B-cutting line in FIG. 3, according to an embodiment of the present inventive concept.

Referring to FIGS. 3 and 4, according to an embodiment of the present inventive concept, a semiconductor device 200 is shown that includes a channel implant 230 having the same doping as the doping for the source/drain region 222. The channel implant 230 is located under a portion of the polysilicon trace 204 and under a portion of the CAREC 218 so that when the CAREC 218 extends below the top surface of the silicon trace 202, instead of electrically contacting p-doped and n-doped regions, the CAREC 218 electrically contacts two regions having the same doping (e.g., p-p in the case of a PFET, and n-n in the case of an NFET), thereby avoiding a short.

The semiconductor device 200 includes silicon traces 202. A layer of polycrystalline silicon is applied on the silicon traces 202, and etched using known lithographic processes to form a plurality of polysilicon traces 204 on portions of the substrate including the silicon traces 202. FIG. 3 shows the configuration of the silicon and polysilicon traces 202, 204 with respect to each other. Dielectric layers 210 and 212 are formed on the structure including the polysilicon traces 204. Alternatively, a single dielectric layer, or more than two dielectric layers may be formed instead of the two dielectric layers 210 and 212. The dielectric layers 210 and 212 are etched to form cavities, such as cavity 213, shown in FIG. 4. Then a conductive material such as, for example, tungsten, is deposited in the cavities to form conductive pillars. These pillars form the CAs 214, 216 that electrically contact the silicon and polysilicon traces 202, 204, respectively. The pillars also form the CARECs 218 to connect a gate (e.g., polysilicon trace 204) of one transistor to a source or drain of another transistor in close proximity.

With reference to FIG. 4, the source/drain regions 222 include a silicide layer 223 formed over a doped portion, in this case, a P-type doped portion. When the dielectric layers 210 and 212 are etched to form the cavity 213, part of the silicide layer 223 and part of the upper portion of the silicon trace 202 may be lost, thereby allowing the CAREC 218 to extend below the upper surface of the silicon trace 202.

Figure 1:
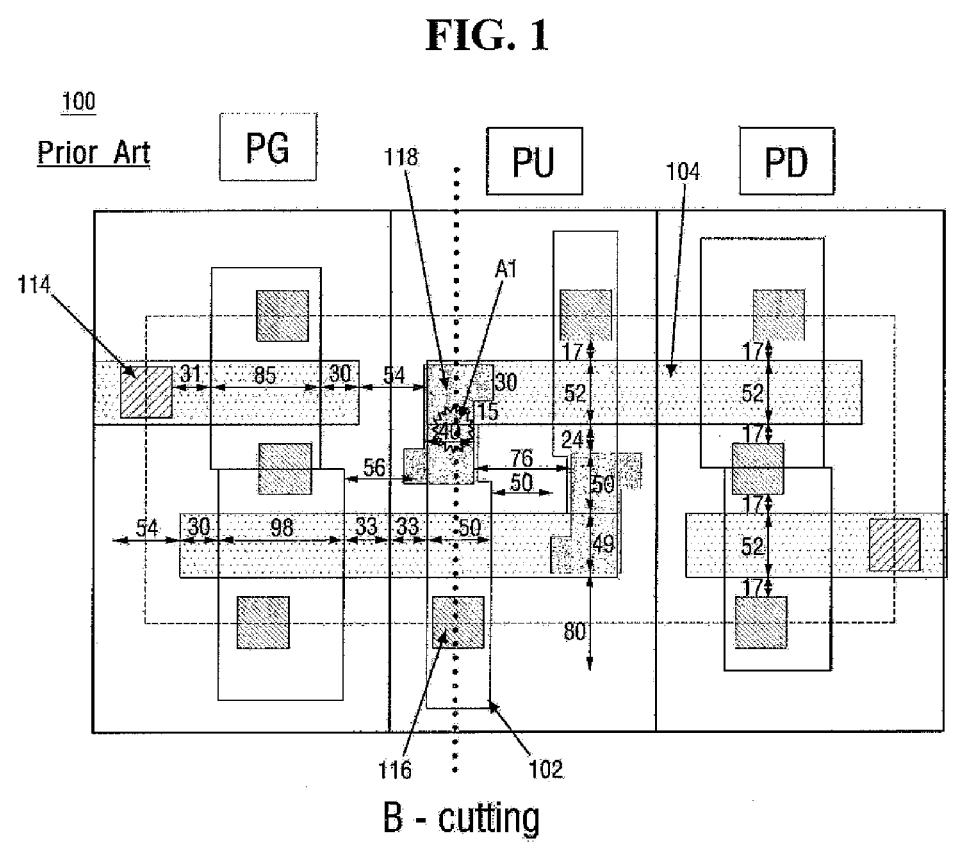

Prior to application of the layer of polycrystalline silicon on the silicon trace 202, the substrate is prepared so that the channel implant 230 having the same doping as the source/drain regions 222 is appropriately located. Comparing the device 200 according to an embodiment of the inventive concept shown in FIG. 3 with the conventional device 100 shown in FIG. 1, it can be seen that the area 250 comprising a first dopant (in this case n, but can be p in the case of an NFET) is reduced to a predetermined area, and the area comprising a second dopant (in this case p, but can be n in the case of an NFET) is increased. For example, after formation of a deep well having the first dopant in the substrate, channel implantation with the second dopant is performed. Unlike what is shown in the conventional device 100 of FIG. 1, by changing the size and shape of the photoresists used during implantation (e.g., reducing the size of a photoresist covering an area comprising the first dopant, and increasing the size of a photoresist covering the area comprising the second dopant), the channel implantation with the second dopant covers a larger area than in the conventional device. As a result, a portion 230 including part of the channel region under the polysilicon trace 204 and under the CAREC 218 is doped with the second dopant, where it was conventionally doped with the first dopant. As a result the junction caused by the CAREC 218 extending below the surface of the silicon trace 202 is formed between two areas having the same type doping, so that no short occurs. As can be seen with reference to FIG. 3, the area 250 including the first dopant is reconfigured in shape and size so that it does not cover the area A2 under the CAREC 218. The first dopant area 250 is reduced at upper left and lower right portions of the pull-up transistor area PU in FIG. 3 to avoid those portions under the CARECs 218. According to the embodiment shown in FIG. 3, the first dopant area includes upper and lower vertical branches 241 and 243 joined by a middle branch 242 making an obtuse angle with respect to the upper and lower branches, respectively. As can be seen from FIG. 4, according to an embodiment of the inventive concept, the implant 230 is formed adjacent an isolation region 235. According to an embodiment of the inventive concept, the implant 230 may include a distance of about 10 nm between a boundary of an active area RX and a boundary of the polysilicon trace 204.

The first dopant area may take a variety of shapes as long as the area avoids the portions under the CARECs that could potentially cause a short when the CARECs are extended due to overetching of the cavities. For example, according to the embodiment shown in FIG. 5, the first dopant area 350 essentially includes two rectangular portions located at upper right and lower left portions 341, 343 of the pull-up transistor PU of FIG. 5. The upper and lower portions 341 and 343 slightly overlap and are connected at O. Similar to the embodiment shown in FIG. 3, the first dopant area 350 is reduced to avoid those portions, like area A3, under the CARECs 318.

Figure 5:
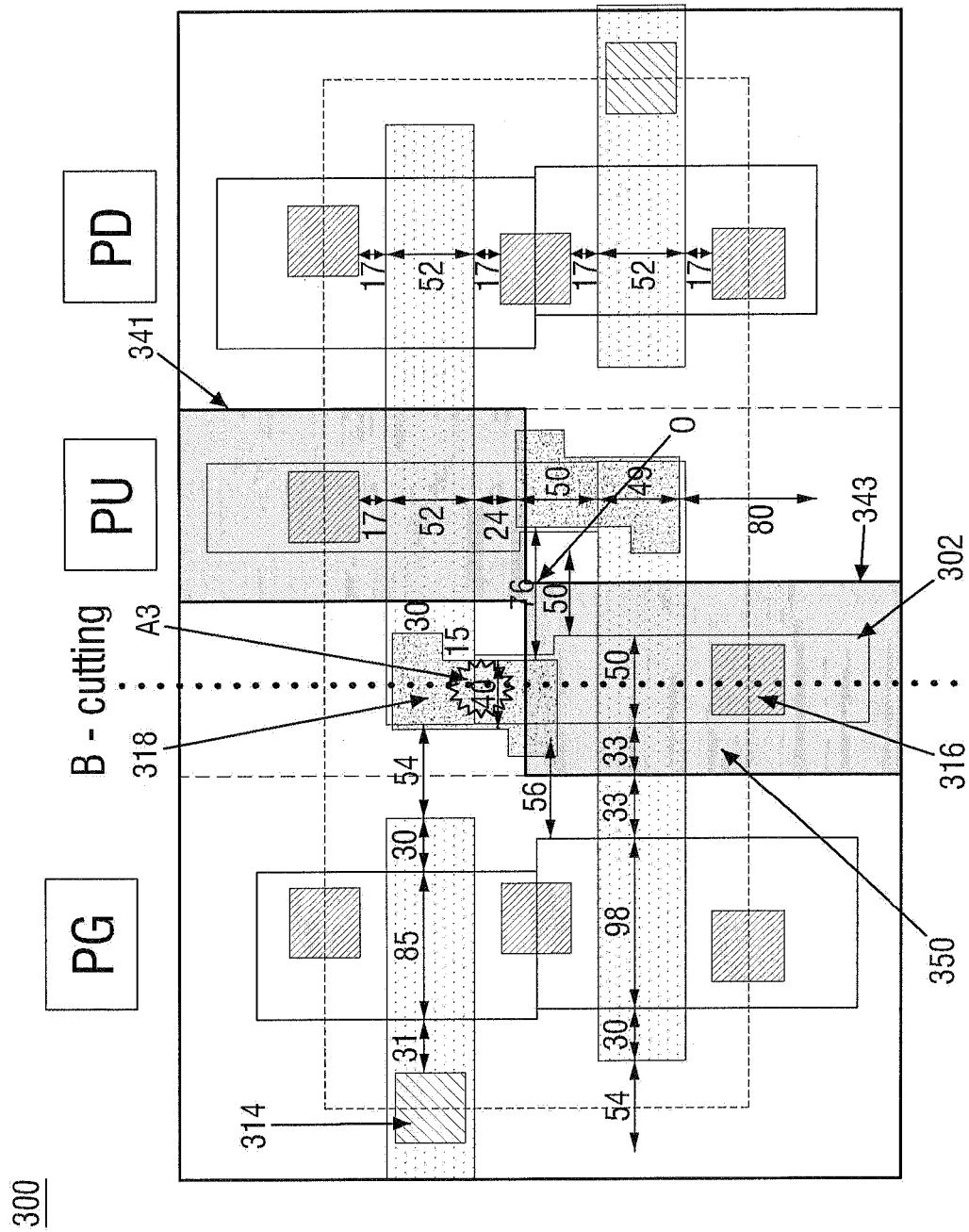
FIG. 5 is a plan view of a semiconductor device according to an embodiment of the present inventive concept.
Figure 6:
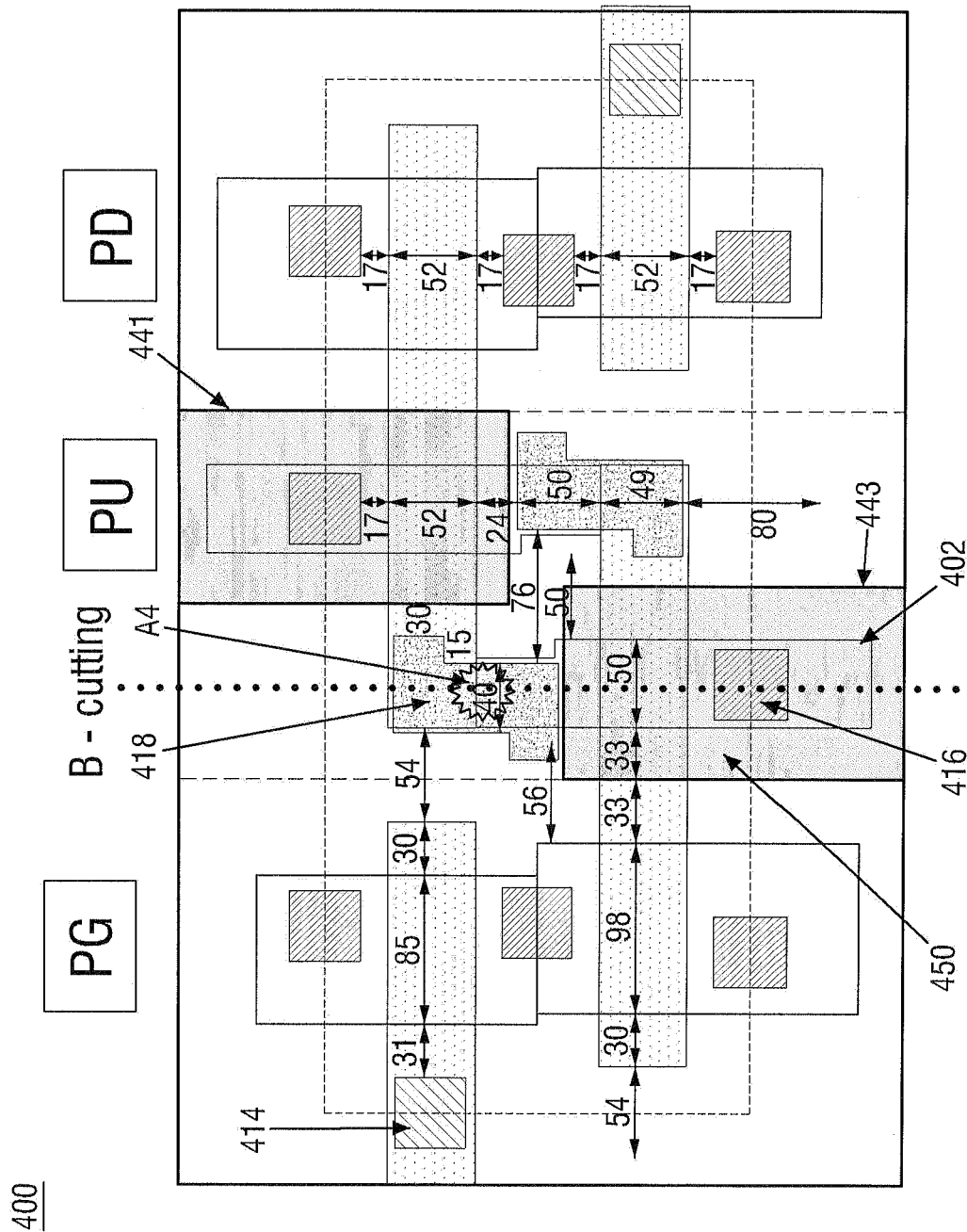
FIG. 6 is a plan view of a semiconductor device according to an embodiment of the present inventive concept.

The embodiment shown in FIG. 6 is similar to the embodiment shown in FIG. 5, except that the upper and lower portions 441 and 443 of the first dopant area 450 are spaced apart from each other and are shorter than the upper and lower portions 341 and 343 of the embodiment shown in FIG. 5. Similar to the embodiments shown in FIGS. 3 and 5, the first dopant area 450 is reduced to avoid those portions, like area A4, under the CARECs 418.

Figure 7:
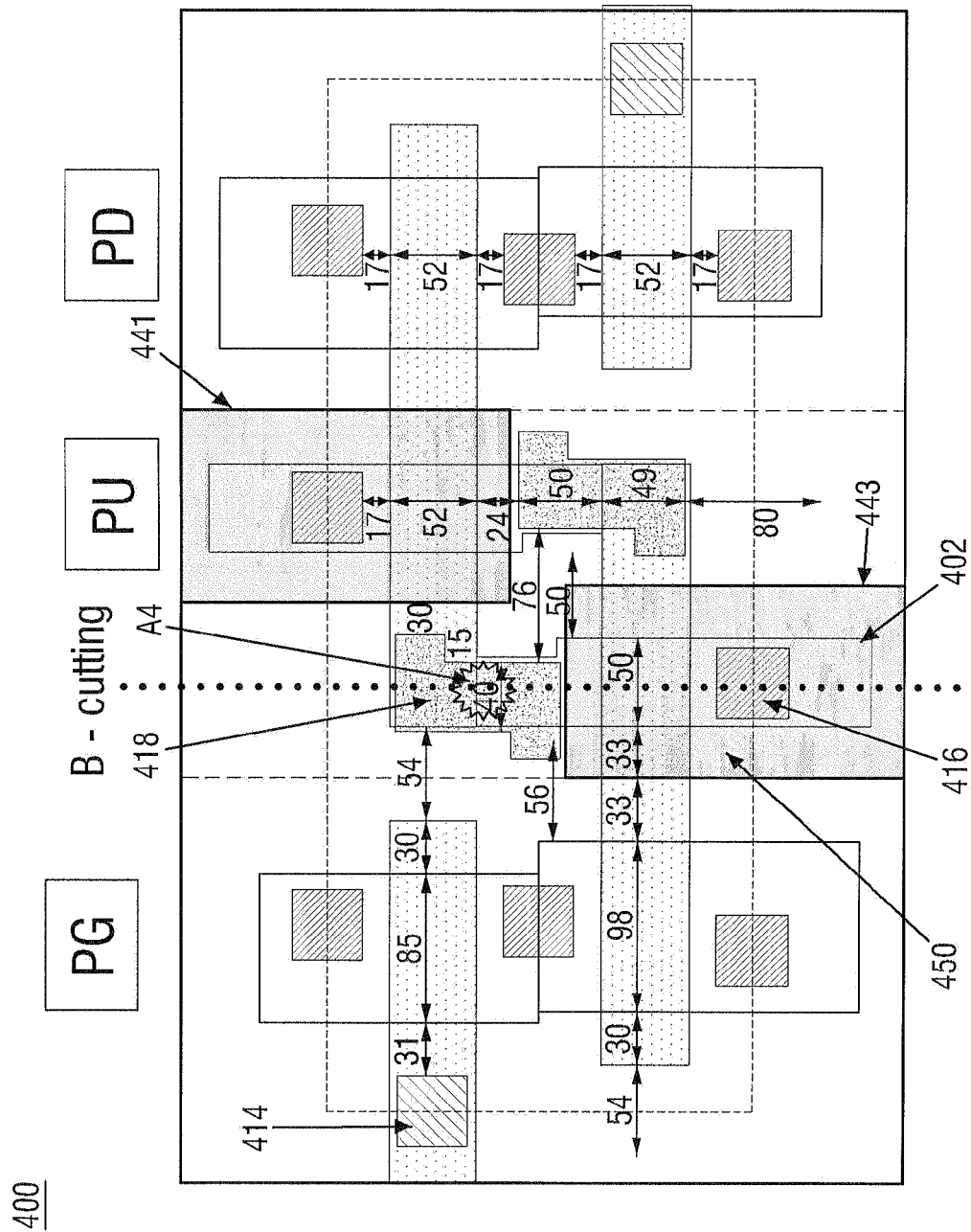
FIG. 7 is a plan view of a semiconductor device according to an embodiment of the present inventive concept.

Referring to FIG. 7, the embodiment shown in FIG. 7 is similar to the embodiment shown in FIG. 6, except that the upper and lower portions 541 and 543 of the first dopant area 550 are longer and narrower than the upper and lower portions 441 and 443 of the embodiment shown in FIG. 6, and extend to overlap part of the CARECs 518. Similar to the embodiments shown in FIGS. 3, 5 and 6, the first dopant area 550 is reduced to avoid those portions, like area A5, under the CARECs 518.

Figure 8:
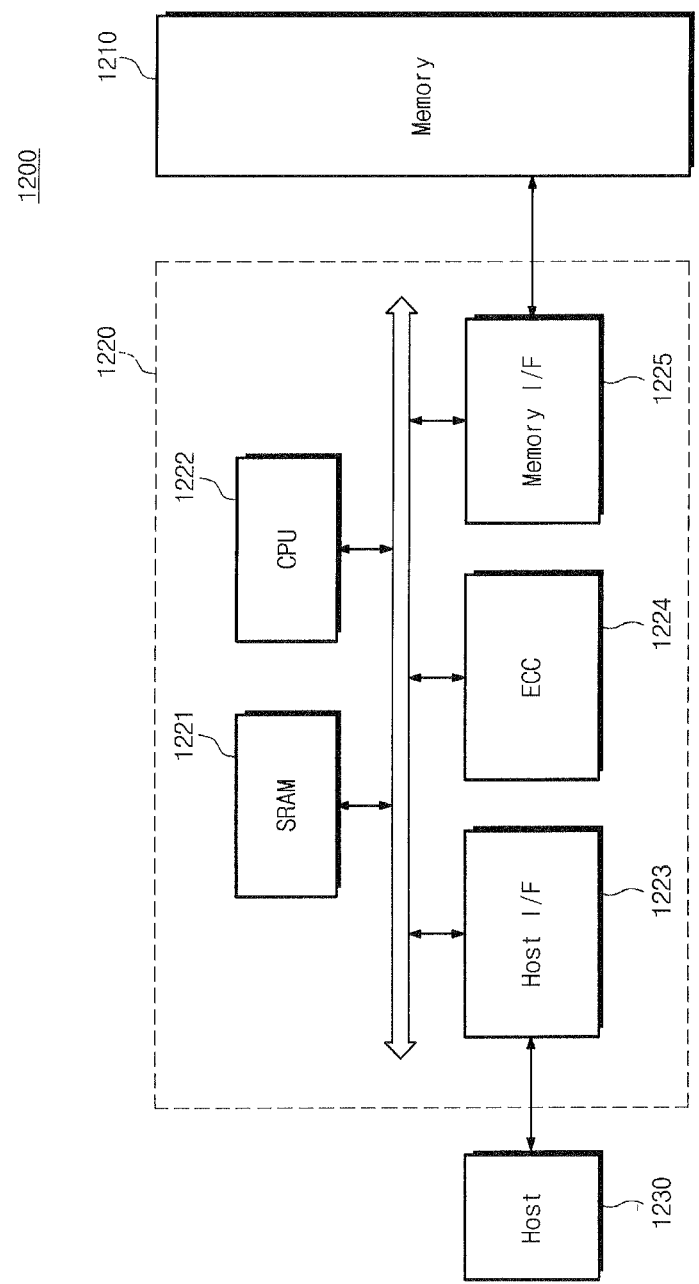
FIG. 8 is a block diagram of a memory card having a semiconductor device according to an embodiment of the inventive concept.

FIG. 8 is a block diagram of a memory card having a semiconductor device according to an embodiment of the inventive concept.

Referring to FIG. 8, a semiconductor memory 1210 including semiconductor devices according to various embodiments of the inventive concept may be applicable to a memory card 1200. For example, the memory card 1200 includes a memory controller 1220 that controls data exchange between a host and the memory 1210. An SRAM 1221 may be used as a working memory of a central processing unit (CPU) 1222. A host interface (I/F) 1223 may have a data exchange protocol of the host connected to the memory card 1200. An error correction code (ECC) 1224 detects and corrects an error in data read from the memory 1210. A memory interface (I/F) 1225 interfaces with the memory 1210. The CPU 1222 performs an overall control operation for data exchange of the memory controller 1220.

Figure 9:
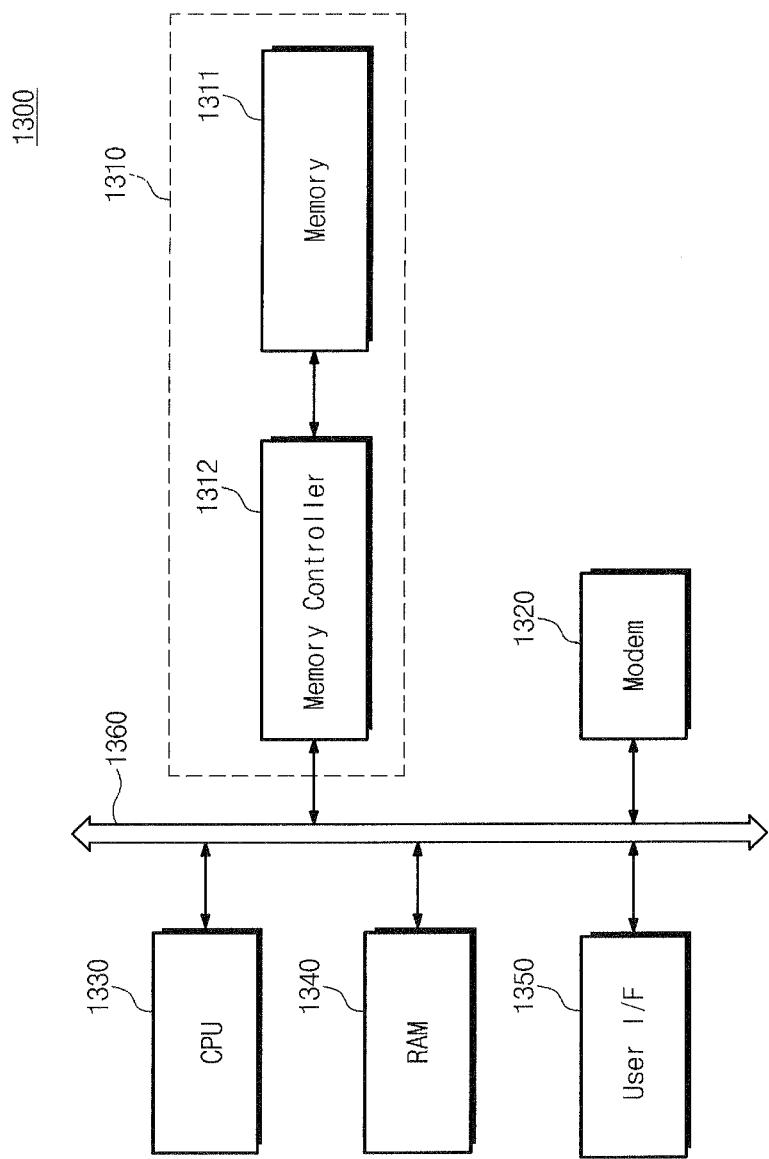
FIG. 9 is a block diagram of an information processing system using a semiconductor device according to an embodiment of the inventive concept.

FIG. 9 is a block diagram of an information processing system using a semiconductor device according to an embodiment of the inventive concept.

Referring to FIG. 9, an information processing system 1300 may include a memory system 1310 having a semiconductor device according to an embodiment of the inventive concept. Examples of the information processing system 1300 include mobile devices and computers. For example, the information processing system 1300 includes a memory system 1310, a modem 1320, a central processing unit (CPU) 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 8. Data processed by the CPU 1330 or data received from an external device may be stored in the memory system 1310. The information processing system 1300 may be provided for memory cards, solid state disks, camera image sensors, and other application chipsets. For example, the memory system 1310 may be configured using a solid state disk (SSD). In this case, the information processing system 1300 can store a large amount of data in the memory system 1310 stably and reliably.

Figure 10:
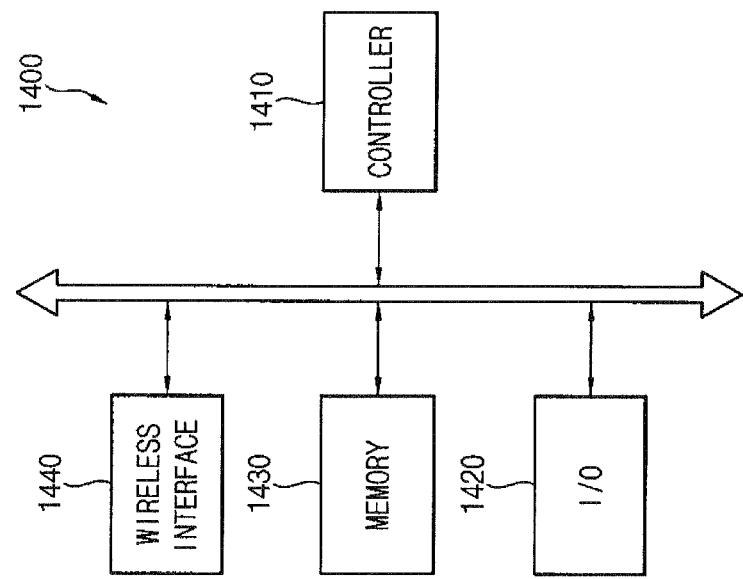
FIG. 10 is a block diagram of an electronic device including a semiconductor device according to exemplary embodiments of the present inventive concept.

Referring to FIG. 10, an electronic device including a semiconductor device according to exemplary embodiments of the present inventive concept will be described. The electronic device 1400 may be used in a wireless communication device (e.g., a personal digital assistant, a laptop computer, a portable computer, a web tablet, a wireless telephone, a mobile phone and/or a wireless digital music player) or in any device capable of transmitting and/or receiving information via wireless environments.

The electronic device 1400 includes a controller 1410, an input/output (I/O) device 1420 (e.g., a keypad, a keyboard, and a display), a memory 1430 having a semiconductor device according to at least one embodiment of the present inventive concept, and a wireless interface 1440. The controller 1410 may include at least one of a microprocessor, a digital signal processor, or a similar processing device. The memory 1430 may be used to store commands executed by the controller 1410, for example. The memory 1430 may be used to store user data. The memory 1430 includes a semiconductor device according to at least one embodiment of the present inventive concept. The electronic device 1400 may utilize the wireless interface 1440 to transmit/receive data via a wireless communication network. For example, the wireless interface 1440 may include an antenna and/or a wireless transceiver. The electronic device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Although exemplary embodiments of the present inventive concept have been described hereinabove, it should be understood that the present inventive concept is not limited to these embodiments, but may be modified by those skilled in the art without departing from the spirit and scope of the present inventive concept.

What is claimed is:

1. A semiconductor device, comprising:
a silicon trace doped with a first dopant;
an isolation region formed in the silicon trace;
a first polysilicon trace formed on the silicon trace;
a second polysilicon trace adjacent to the first polysilicon trace and formed on the silicon trace and the isolation region;
a source/drain region formed in the silicon trace between the first and the second polysilicon traces, wherein the source/drain region is doped with a second dopant opposite the first dopant;
a channel region in the silicon trace under the first polysilicon trace and doped with the first dopant;
a doping region formed in the silicon trace and between the source/drain region and the isolation region, wherein the doping region is doped with the second dopant and is partially overlapped by the second polysilicon trace; and
a dielectric layer formed on the first and second polysilicon traces and on the source/drain region, wherein the dielectric layer includes a cavity filled with a conductive material to form a contact area, the contact area overlapping part of the source/drain region and the second polysilicon trace to electrically connect the second polysilicon trace with the source/drain region.

2. The semiconductor device according to claim 1, wherein part of the contact area extends below an upper surface of the silicon trace to electrically connect the doping region to the source/drain region.

3. The semiconductor device according to claim 2, wherein the contact area is a contact area of a rectangle structure.

4. The semiconductor device according to claim 1, wherein the conductive material includes tungsten.

5. The semiconductor device according to claim 1, further comprising another dielectric layer formed on the dielectric layer, wherein both dielectric layers include the cavity.

6. The semiconductor device according to claim 1, further comprising a silicide layer formed below an upper surface of the silicon trace in the source/drain region.

7. A computer system comprising the semiconductor device of claim 1, wherein the computer system is one of a personal computer (PC), a personal digital assistant (PDA), an MP3 player, a digital audio recorder, a pen-shaped computer, a digital camera, or a video recorder.

8. A system for transmitting or receiving data, the system comprising:
a memory device for storing a program; and
a processor in communication with the memory device, wherein the memory device comprises:
a silicon trace doped with a first dopant;
an isolation region formed in the silicon trace;
a first polysilicon trace formed on the silicon trace;
a second polysilicon trace adjacent to the first polysilicon trace and formed on the silicon trace and the isolation region;
a source/drain region formed in the silicon trace between the first and the second polysilicon traces, wherein the source/drain region is doped with a second dopant opposite the first dopant;
a channel region in the silicon trace under the first polysilicon trace and doped with the first dopant;
a doping region formed in the silicon trace and between the source/drain region and the isolation region, wherein the doping region is doped with the second dopant and is partially overlapped by the second polysilicon trace; and
a dielectric layer formed on the first and second polysilicon traces and on the source/drain region, wherein the dielectric layer includes a cavity filled with a conductive material to form a contact area, the contact area overlapping part of the source/drain region and the second polysilicon trace to electrically connect the second polysilicon trace with the source/drain region.

9. The system according to claim 8, wherein the doping region is next to the source/drain region and includes part of a channel region in the substrate under the second polysilicon trace.

10. The system according to claim 8, wherein the system comprises at least one of a mobile system, a portable computer, a web tablet, a mobile phone, a digital music player, or a memory card.

11. A semiconductor memory card, comprising:
an interface part that interfaces with an external device;

a controller that communicates with the interface part and a memory device via address and data buses, wherein the memory device comprises:
  a silicon trace doped with a first dopant;
  an isolation region formed in the silicon trace;
  a first polysilicon trace formed on the silicon trace;
  a second polysilicon trace adjacent to the first polysilicon trace and formed on the silicon trace and the isolation region;
  a source/drain region formed in the silicon trace between the first and the second polysilicon traces wherein the source/drain region is doped with a second dopant opposite the first dopant;
  a channel region in the silicon trace under the first polysilicon trace and doped with the first dopant;
  a doping region formed in the silicon trace and between the source/drain region and the isolation region, wherein the doping region is doped with the second dopant and is partially overlapped by the second polysilicon trace; and
  a dielectric layer formed on the first and second polysilicon traces and on the source/drain region, wherein the dielectric layer includes a cavity filled with a conductive material to form a contact area, the contact area overlapping part of the source/drain region and the second polysilicon trace to electrically connect the second polysilicon trace with the source/drain region.

* * * * *